United States Patent
Tsunami

(10) Patent No.: US 11,205,704 B2
(45) Date of Patent: Dec. 21, 2021

(54) SEMICONDUCTOR DEVICE AND PRODUCTION METHOD THEREFOR

(71) Applicant: Mitsubishi Electric Corporation, Tokyo (JP)

(72) Inventor: Daisuke Tsunami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/768,603

(22) PCT Filed: Feb. 1, 2018

(86) PCT No.: PCT/JP2018/003419
§ 371 (c)(1),
(2) Date: May 29, 2020

(87) PCT Pub. No.: WO2019/150526
PCT Pub. Date: Aug. 8, 2019

(65) Prior Publication Data
US 2021/0175337 A1    Jun. 10, 2021

(51) Int. Cl.
*H01L 29/417*    (2006.01)
*H01L 21/768*    (2006.01)
(Continued)

(52) U.S. Cl.
CPC .... *H01L 29/4175* (2013.01); *H01L 21/76898* (2013.01); *H01L 23/481* (2013.01);
(Continued)

(58) Field of Classification Search
CPC ............. H01L 21/76898; H01L 23/481; H01L 29/4175; H01L 29/0657; H01L 29/401; H01L 29/45
See application file for complete search history.

(56) References Cited

U.S. PATENT DOCUMENTS

| 5,236,854 A | 8/1993 | Higaki et al. |
| 2007/0126026 A1 | 6/2007 | Ueno et al. |

(Continued)

FOREIGN PATENT DOCUMENTS

| JP | H03-181138 A | 8/1991 |
| JP | 2006-295073 A | 10/2006 |

(Continued)

OTHER PUBLICATIONS

International Search Report issued in PCT/JP2018/003419; dated Apr. 10, 2018.

*Primary Examiner* — Herve-Louis Y Assouman
(74) *Attorney, Agent, or Firm* — Studebaker & Brackett PC

(57) ABSTRACT

Because of inclusion of: a source electrode that is formed on a front surface of a semiconductor substrate and that is joined to the semiconductor substrate both at a source electrode as a first contact region that is an ohmic contact region and at a source electrode as a second contact region that is a contact region with a non-ohmic contact or the like; a back-surface electrode formed on a back surface of the semiconductor substrate; and a through hole in which an interconnection is provided that connects the source electrode as the second contact region in the source electrode with the back-surface electrode; it is possible not only to improve the corrosion resistance but also to reduce the leakage current, so that a highly-reliable semiconductor device suited for high frequency operation is provided.

20 Claims, 11 Drawing Sheets

(51) Int. Cl.
  *H01L 23/48* (2006.01)
  *H01L 29/06* (2006.01)
  *H01L 29/40* (2006.01)
  *H01L 29/45* (2006.01)

(52) U.S. Cl.
  CPC ........ *H01L 29/0657* (2013.01); *H01L 29/401* (2013.01); *H01L 29/45* (2013.01)

(56) References Cited

U.S. PATENT DOCUMENTS

| | | | |
|---|---|---|---|
| 2007/0210329 A1 | 9/2007 | Goto | |
| 2009/0001478 A1 | 1/2009 | Okamoto | |
| 2009/0166677 A1 | 7/2009 | Shibata et al. | |
| 2009/0218598 A1 | 9/2009 | Goto | |
| 2010/0320505 A1 | 12/2010 | Okamoto et al. | |
| 2011/0115025 A1* | 5/2011 | Okamoto | H01L 29/4175 257/368 |
| 2011/0241074 A1 | 10/2011 | Okamoto | |
| 2012/0115327 A1 | 5/2012 | Miki | |
| 2013/0248879 A1* | 9/2013 | Gambin | H01L 29/7786 257/77 |
| 2013/0288401 A1* | 10/2013 | Matsuura | H01L 22/10 438/14 |
| 2014/0131871 A1* | 5/2014 | Tsai | H01L 21/2885 257/750 |
| 2015/0056763 A1 | 2/2015 | Hobart et al. | |
| 2015/0084103 A1 | 3/2015 | Okazaki et al. | |

FOREIGN PATENT DOCUMENTS

| | | |
|---|---|---|
| JP | 2007-157829 A | 6/2007 |
| JP | 2007-242853 A | 9/2007 |
| JP | 2009-033097 A | 2/2009 |
| JP | 2009-164158 A | 7/2009 |
| JP | 2011-003652 A | 1/2011 |
| JP | 2012-099761 A | 5/2012 |
| JP | 2014-110311 A | 6/2014 |
| JP | 2015-065233 A | 4/2015 |
| JP | 2015-517205 A | 6/2015 |
| JP | 2016-528744 A | 9/2016 |
| WO | 2015/080107 A1 | 6/2015 |

* cited by examiner

SEMICONDUCTOR DEVICE AND PRODUCTION METHOD THEREFOR

TECHNICAL FIELD

The present invention relates to a semiconductor device having a via-hole or like structure in its semiconductor substrate, and a production method therefor.

BACKGROUND ART

With respect to power amplifiers each employing a high electron mobility transistor (HEMT: High Electron Mobility Transistor) based on a compound semiconductor such as a nitride semiconductor or the like, since the transistor is required to be operated at a high frequency exceeding 1 GHz, many transistor structures have been proposed for accomplishing such a high frequency operation. For example, in Patent Document 1, there is disclosed a transistor whose high-frequency characteristics are improved in such a manner that a via is formed under a source electrode and a potential same as that of the back surface is given to that via, to thereby reduce the source inductance.

With respect to nitride semiconductor-based power amplifiers, because of the change from a GaAs semiconductor to the nitride semiconductor, their transistors are made operable at a high voltage to thereby achieve increased output power of the power amplifiers. However, heat generated from the transistors is becoming non-negligible as the output power increases, and this becomes a problem in further increasing the output power of the power amplifiers. For that reason, in Patent Document 2, there is proposed a structure in which diamond is formed on the back surface of a semiconductor substrate to thereby enhance the heat dissipation capability of the transistor.

CITATION LIST

Patent Document

Patent Document 1: Japanese Patent Application Laid-open No. H03-181138 (Lines 2 to 20 in Upper-left Column in Page 2; FIG. 5)
Patent Document 2: Japanese National Publication of International Patent Application No. 2016-528744 (Paragraphs 0016 to 0022, FIG. 1)

SUMMARY OF THE INVENTION

Problems to be Solved by the Invention

Like in the source electrode structure described in Patent Document 1, it is usual to make the source electrode ohmic; however, such an ohmic source electrode has insufficient corrosion resistance, so that there is a problem that the source electrode may be partially dissolved out during producing or after producing to thereby cause trouble, such as a faulty ohmic contact, a floated electrode, or the like.

Meanwhile, the transistor structure of Patent Document 2 is superior in heat dissipation capability because of the formation of diamond on the back surface of the substrate; however, its source electrode on the front-surface side of the semiconductor substrate and its back-surface electrode are not connected to each other through a vial hole and thus the inductance of the source electrode is high, so that it is difficult to operate the transistor at a high frequency.

This invention has been made to solve the problems as described above, and an object thereof is to provide a highly-reliable semiconductor device which has high corrosion resistance and is suited for high frequency operation, and a production method therefor.

Means for Solving the Problems

A semiconductor device according to the invention is characterized by comprising: a source electrode or a drain electrode that is formed on a front surface of a semiconductor substrate, and that is joined to the semiconductor substrate both at a first contact region of that electrode and at a second contact region thereof; a back-surface electrode formed on a back surface of the semiconductor substrate; and a through hole in which an interconnection is provided that connects the second contact region of the source electrode or the drain electrode with the back-surface electrode.

A semiconductor device production method according to the invention is characterized by comprising: a step of forming, on a front surface of a semiconductor substrate, a pattern for a source electrode or a drain electrode as a first contact region, and thereafter joining the semiconductor substrate to the pattern for the source electrode or the drain electrode as the first contact region by heating or by ion implantation, to thereby form the source electrode or the drain electrode as the first contact region; a step of forming a pattern for a source electrode or a drain electrode as a second contact region, to be adjoined to the source electrode or the drain electrode as the first contact region, to thereby form the source electrode or the drain electrode as the second contact region; a step of creating, in the semiconductor substrate and beneath the source electrode or the drain electrode as the second contact region, a through hole that penetrates through the semiconductor substrate; and a step of connecting, after formation of a back-surface electrode on a back surface of the semiconductor substrate, the source electrode or the drain electrode as the second contact region with the back-surface electrode through the through hole.

Effect of the Invention

According to the invention, the source electrode or the drain electrode is joined to the semiconductor substrate both at the first contact region with an ohmic contact and at the second contact region with a non-ohmic contact or the like, so that it is possible to improve corrosion resistance and thus to provide a highly-reliable semiconductor device suited for high frequency operation.

MODES FOR CARRYING OUT THE INVENTION

Embodiment 1

Figure 1:
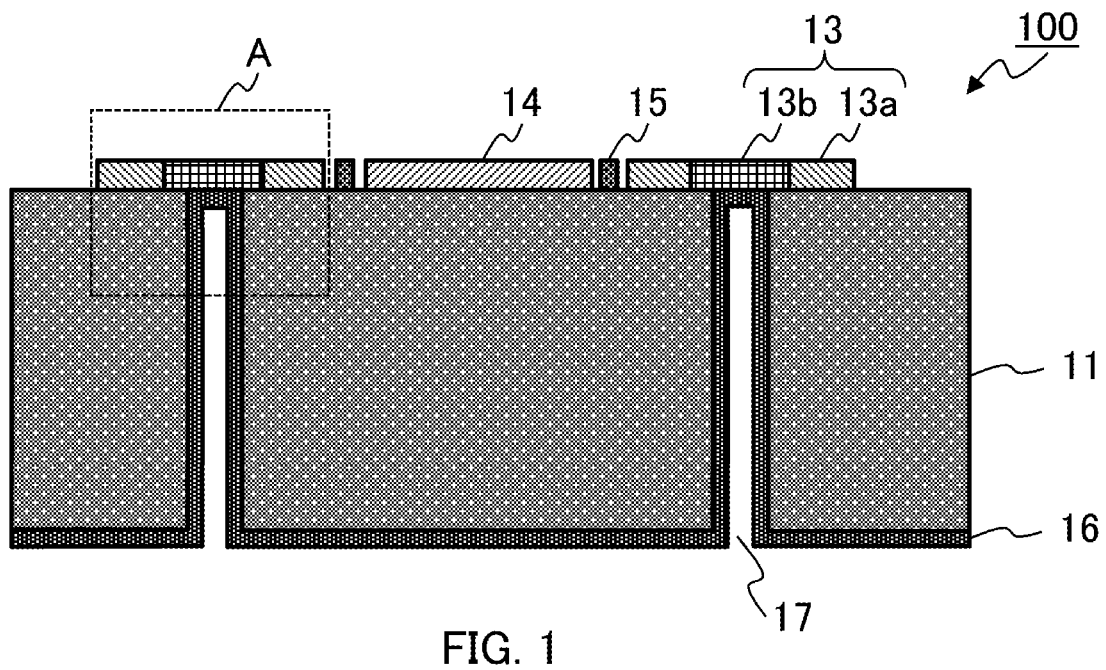
FIG. 1 is a sectional view showing a configuration of a semiconductor device according to Embodiment 1 of the invention.

FIG. 1 is a sectional view showing a configuration of a semiconductor device 100 according to Embodiment 1 of the invention. As shown in FIG. 1, the semiconductor device 100 is provided with a source electrode 13 (source electrodes 13a each as a first contact region, a source electrode 13b as a second contact region), a drain electrode 14, and a gate electrode 15, on a front-surface side of a semiconductor substrate 11, and is provided with a back-surface electrode 16 on a back-surface side of the semiconductor substrate 11, wherein the source electrode 13 (the source electrode 13b as the second contact region) and the back-surface electrode 16 are electrically connected to each other through a through hole 17. Note that the words "front surface" and "back surface" are used just for convenience sake, and impose no particular limitation.

As the semiconductor substrate 11, a substrate made of a material, such as SiC, GaN, $Al_2O_3$, Si, GaAs, InP, diamond or the like, is used. In the case of high frequency operation, although the thickness of the semiconductor substrate 11 is desired to be in a range of not less than 10 μm but not more than 200 μm, it may be out of this range. However, when the thickness exceeds 200 μm, due to increased parasitic inductance, it will be difficult to ensure the high-frequency characteristics. Thus, when it exceeds 200 μm, it is desired to create a concave region in the semiconductor substrate so that the thickness inside the concave region becomes not more than 200 μm. When the thickness is less than 10 μm, such a case may arise that cracking occurs in the semiconductor substrate 11 made of a compound, or deterioration occurs in the insulation property. In order to ensure the insulation property, the semiconductor substrate 11 is desired to have a resistivity of $1\times10^5$ [Ωcm] or more.

The source electrode 13, the drain electrode 14, the gate electrode 15 and the back-surface electrode 16 are each formed of a metal, such as Cu, Ti, Al, Au, Ni, Nb, Pd, Pt, Cr, W, Ta, Mo or the like. Note that the respective electrodes including the back-surface electrode may each be formed of a multi-layer structure.

It is usual to cause the source electrode 13 (the source electrodes 13a as the first contact regions) and the drain electrode 14 to form ohmic junctions with the semiconductor substrate 11, and to cause the gate electrode 15 to form a Schottky junction with that substrate. An ohmic contact (junction) at a metal-semiconductor interface can be formed by a heat treatment of annealing or the like after deposition of multiple elements (containing an element other than metal) on a semiconductor substrate by vapor deposition or the like. After the annealing treatment, a modified layer containing a plurality of elements is formed at the metal-semiconductor interface. Further, as another method for forming an ohmic contact, a method in which impurities are added into the semiconductor substrate 11 followed by epitaxial growth, a method in which impurities are diffused into the substrate using ion implantation or thermal diffusion, or a method that combines plural methods selected from among the methods described above, is used.

Figure 2:
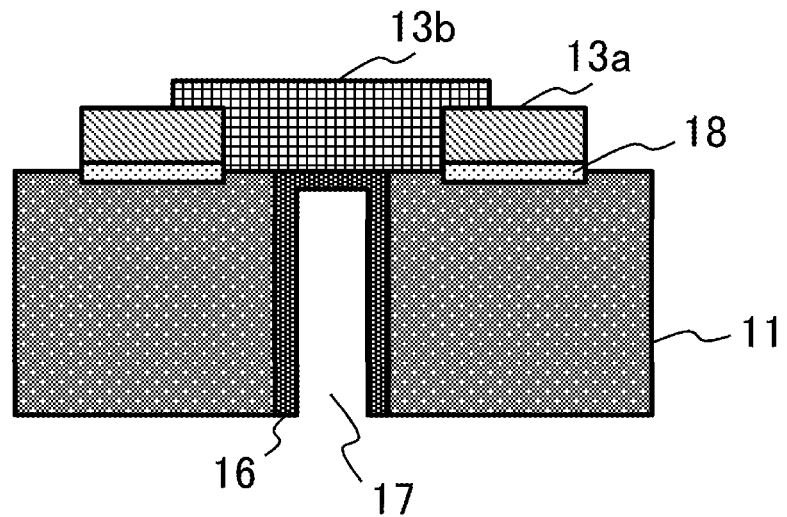
FIG. 2 is an enlarged sectional view showing a configuration of a source electrode in the semiconductor device according to Embodiment 1 of the invention.
Figure 3:
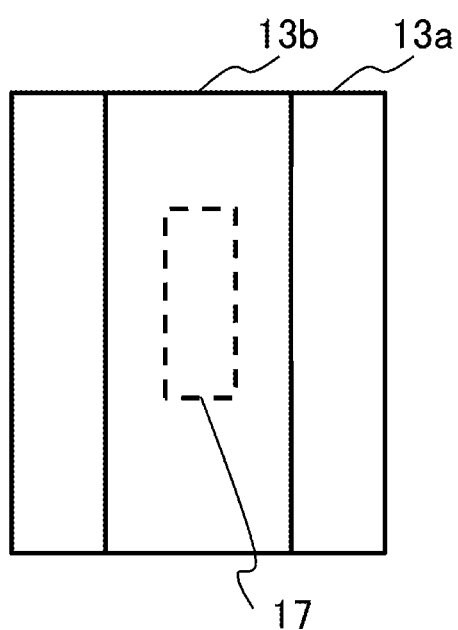
FIG. 3 is a plan view showing a configuration of the source electrode in the semiconductor device according to Embodiment 1 of the invention.
Figure 4:
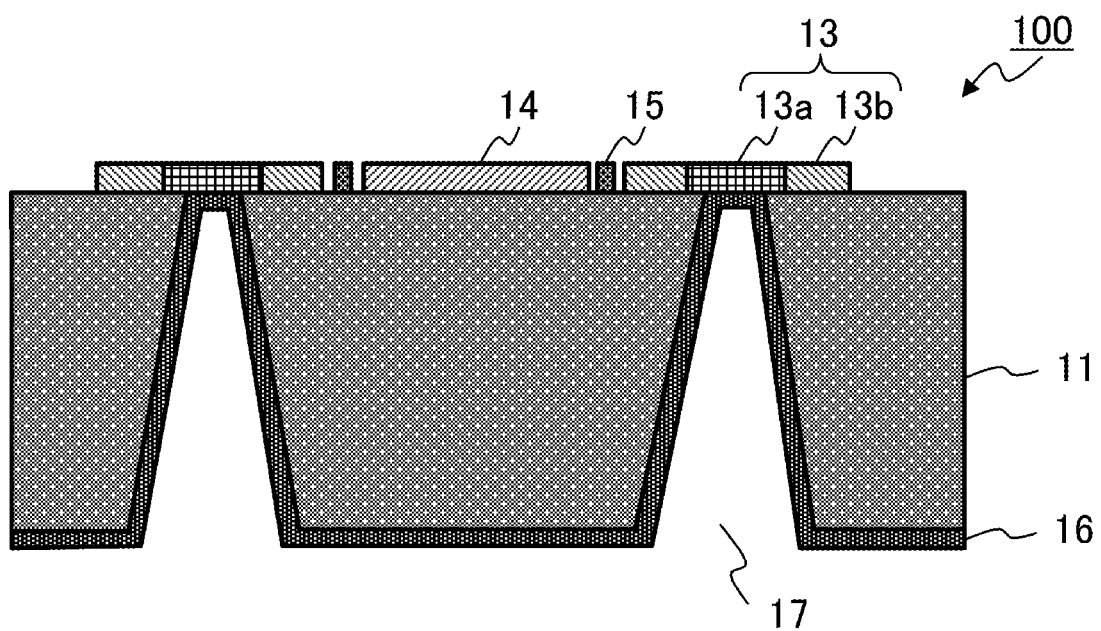
FIG. 4 is a sectional view showing another configuration of the semiconductor device according to Embodiment 1 of the invention.

Next, description will be made about a configuration of the source electrode 13 in the semiconductor device 100 according to Embodiment 1 of the invention. FIG. 2 is an enlarged sectional view of a region A that is corresponding to the portion of the source electrode 13 in FIG. 1. FIG. 3 is a plan view of the source electrode 13. As shown in FIG. 2 and FIG. 3, the source electrode 13 is formed on the semiconductor substrate 11, in which the source electrode 13b as the second contact region is provided between the source electrodes 13a as the first contact regions arranged in two rows. The back surface of the source electrode 13b as the second contact region is electrically connected to the back-surface electrode 16 through the though hole 17. In FIG. 3, a portion illustrated by a dotted line corresponds to the through hole 17 created from the back surface of the semiconductor substrate 11. With respect the surface in the through hole 17 and the back-surface electrode 16, it is desired that they are in non-ohmic contact with each other. Note that, although the through hole 17 may be a perpendicularly-extending through hole as shown in FIG. 1, it may also be a taper-shaped through hole as shown in FIG. 4.

Because of the annealing treatment, with the source electrode 13a as the first contact region, a modified layer 18 is formed at the electrode-semiconductor interface. Accordingly, an ohmic contact region as the first contact region is formed. An ohmic contact is a resistive contact, and in this invention, it is desired that its contact resistivity is not less than $1.0\text{E}{-}8\Omega\text{cm}^2$ but not more than $1.0\text{E}{-}3\Omega\text{cm}^2$. When the contact resistivity is less than $1.0\text{E}{-}8\Omega\text{cm}^2$, due to too much conversion of a semiconductor layer into a metallic state, the corrosion resistance of the semiconductor layer will be degraded. When it exceeds $1.0\text{E}{-}3\Omega\text{cm}^2$, the high-frequency characteristics (power gain cut-off frequency fmax, etc.) will be degraded.

The source electrode 13b as the second contact region is provided after the formation of the source electrodes 13a as the first contact regions, and constitutes a second contact region with no modified layer at the electrode-semiconductor interface. Here, examples of the second contact region include: a non-ohmic contact region with a Schottky contact at a metal-semiconductor interface, a MIS-type Schottky contact at a metal-insulator-semiconductor interface, or the like; and a contact region with a high contact resistivity that exceeds $1.0E-3\Omega cm^2$ but is not more than $1.0E+3\Omega cm^2$. When the contact resistivity is not more than $1.0E-3\Omega cm^2$, the corrosion resistance of the metal or the metal-semiconductor interface will be degraded. When it exceeds $1.0E+3\Omega cm^2$, due to increased source resistance, there is a possibility that the high-frequency characteristics and the output characteristics will be degraded.

When, as the metal of the second contact region (when it is multi-layered, the metal of the lowermost layer), a metal is used that is lower in ionization tendency than the metal of the first contact region (when multi-layered, the metal that is lowest in ionization tendency), it is possible to enhance corrosion resistance of the source electrode. For example, such a case is assumed where the metal structure of Ti/Al/Au is applied to the first contact region and the metal structure of Ti/Au is applied to the second contact region, and in that case, while the metal that is lowest in ionization tendency in the metals of the first contact region is Al, Ti that is lower in ionization tendency than Al is used for the lowermost metal layer in the second contact region. In that case, as shown in FIG. 2, a lower ionization-tendency metal of the second contact region covers the lateral side of the higher ionization-tendency metal of the first contact region, so that it is possible to enhance the corrosion resistance.

Next, based on FIGS. 5A to 5F, description will be made about a production method of the semiconductor device 100 according to Embodiment 1 of the invention. FIGS. 5A to 5F are sectional views showing producing steps of the semiconductor device 100 according to Embodiment 1 of the invention.

Figure 5A:
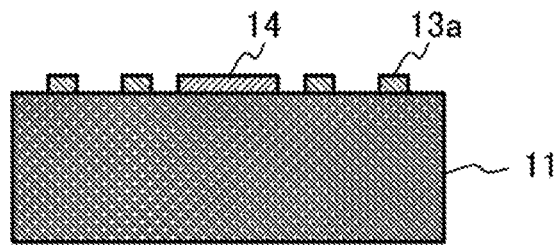
FIGS. 5A to 5F are sectional views showing producing steps of the semiconductor device according to Embodiment 1 of the invention.

First, as shown in FIG. 5A, the source electrodes 13a as the first contact regions and the drain electrode 14 are formed on the semiconductor substrate 11, and thereafter, a heat treatment is applied thereto, so that each modified layer 18 with an ohmic contact is formed. It is appropriate that the heat treatment temperature for such ohmic electrodes is not less than 500° C. but not more than 1200° C. When it is less than 500° C., such problems arise that it is not able to form an ohmic contact and that the high-frequency characteristics and the output characteristics will be degraded because the ohmic resistance is too high. On the other hand, when it exceeds 1200° C., a breakage occurs in the electrode structure due to bumping of the electrode that occurs unbearably under such a high temperature.

With use of resist patterns, patterns of these electrodes can be formed by lift-off processing or dry/wet etching. The source electrodes 13a as the first contact regions and the drain electrode 14 may be formed separately or may be formed together.

Figure 5B:
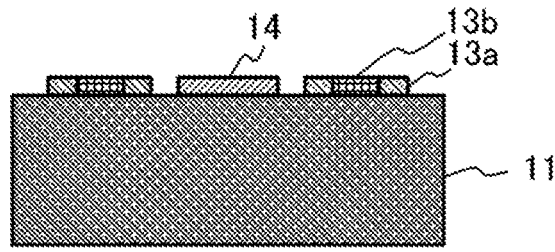

Subsequently, as shown in FIG. 5B, the source electrode 13b as the second contact region is formed. It is appropriate that the heat treatment temperature allowable for such a non-ohmic electrode is not less than the ambient temperature but not more than 500° C. However, when a protective film for diffusion prevention (an insulative film of SiN, SiO or the like, or a high melting-point metal such as W or the like) is included at the metal-semiconductor interface, the heat treatment temperature may exceed the above temperature.

A fabrication method for differently establishing a low ohmic contact of the first contact region and a high ohmic contact or non-ohmic contact of the second contact region, can be implemented by use of different metals (by use of different layer structures when multiple metal layers are applied) in the respective regions. For example, in a GaN-based or SiC-based case, it is exemplified by giving an Al-based metal (or, as a layer structure, Ti/Al/Au or the like) to the first contact region, and a Nb-based metal (or, as a layer structure, Ti/Nb/Au or the like) to the second contact region. Since Al is more reactive than Nb to such a semiconductor, it is possible to differently establish contact resistivities for the respective regions. Further, in the case of using a GaAs-based or InP-based semiconductor, it is appropriate that AuGe, AuGa, Cr or the like that is well-reactive to that semiconductor is used for the first contact region while Ti, Pt, Au or the like that is less-reactive thereto is used for the second contact region.

Another fabrication method is exemplified by diffusing impurity elements into a semiconductor layer corresponding to the first contact region by using ion implantation, but not applying ion implantation to a semiconductor layer corresponding to the second contact region, to thereby give a difference between the doped amounts of the impurity elements in these layers. It is appropriate that their impurity concentrations are not less than $5.0E+20$ cm$^{-3}$ and not more than $2.0E+17$ cm$^{-3}$. In the case of using SiC-based semiconductor, it is appropriate that the impurity elements to be ion-implanted comprise one type or plural types of elements selected from among N, P, As, B, Al, Ga, Be, S, V, O, C and Si. In the case of using GaN-based semiconductor, it is appropriate that the impurity elements to be ion-implanted comprise one type or plural types of elements selected from among O, S, Se, Te, Be, Mg, Ca, C, Si, Ge and Sn. In the case of using diamond as the semiconductor, it is appropriate that the impurity elements to be ion-implanted comprise one type or plural types of elements selected from among N, P, As, Sb, B, Al, Ga, In, Be, S and O.

According to a still another fabrication method, a heat treatment at a high temperature is applied to the metal of the first contact region, and a heat treatment at a temperature lower than the above, or no heat treatment is applied to the metal of the second contact region, and this makes it possible to differently establish contact resistivities for the respective regions.

By appropriately combining the foregoing techniques, it is possible to differently establish contact resistivities for the respective regions. Further, it is also possible to differently establish an ohmic contact and a non-ohmic contact (a Schottky contact). Note that, although the electrode uses a multi-layer structure in many cases, it is important to cause the metal or impurity atoms mentioned above to be placed at the metal-semiconductor interface by use of a heat treatment, ion implantation, crystal growth or the like. For example, in the case of an electrode structure of Ti/Al/Au, Al is diffused up to the semiconductor layer by the heat treatment, so that the metal-semiconductor interface has an ohmic property.

It is noted that a fabrication method for establishing a non-ohmic contact of the second contact region, can be easily implemented by reducing the degree of the ion implantation or the heat treatment to thereby decrease the concentration of the metal atoms or impurities near the surface of the semiconductor layer. When, as the metal to be used, a less chemically-reactive metal having a high melting-point (W, WN, Ta, TaN) or a high work-function metal that has been used for a gate electrode (Ni, Pt, Au, Cu, Rh, Ru or the like) is used, the non-ohmic contact can be achieved easily. Further, it can also be achieved by a MIS structure in which a material, such as a metal oxide film, an insulative film or the like, having a bandgap wider than that of the semiconductor, is interposed at the metal-semiconductor interface.

Figure 5C:
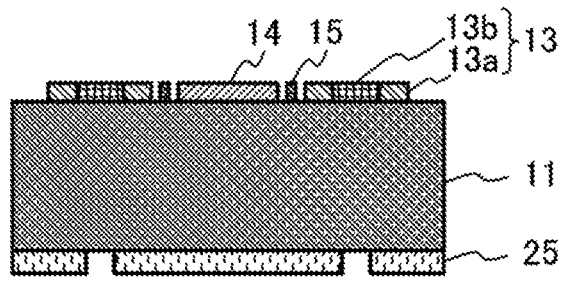

Then, as shown in FIG. 5C, the gate electrode 15 is formed on the front-surface side of the semiconductor substrate 11. An insulative film or a plated wiring may be formed where necessary. Furthermore, a metal mask 25 is formed on the back-surface side of the semiconductor substrate 11. The metal mask 25 may be formed after grinding the semiconductor substrate 11 in order to reduce the plate thickness of the semiconductor substrate.

Figure 5D:
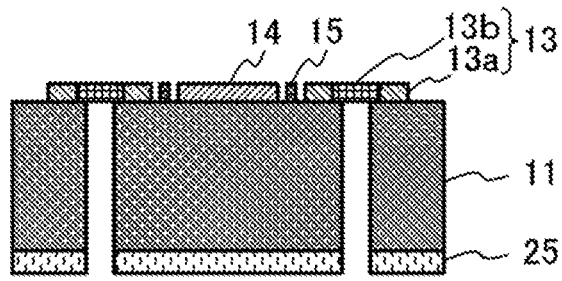

Subsequently, as shown in FIG. 5D, a portion on which the metal mask 25 is not placed is processed by dry etching, to thereby create the through hole 17. Although wet etching may be used, it is better to use dry etching for a less chemically-reactive substrate such as a SiC substrate. It is appropriate that the metal mask 25 is made of a material having a low sputtering yield and whose reaction product with an etching gas is low volatile, such as, Cr, Al, Ni, Cu or the like.

Figure 5E:
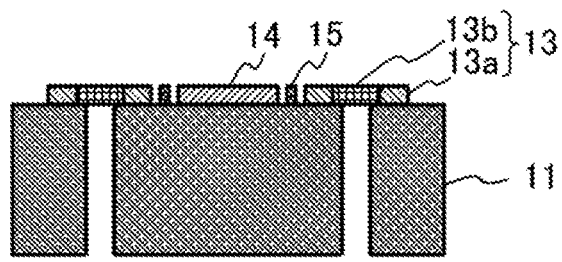

Then, as shown in FIG. 5E, the metal mask 25 is removed. Although the removing method may be dry etching, wet etching may also be used in the case of using a material that is less easily dry-etched. In that case, an acid or alkali may be used.

It is noted that, when a through hole is created beneath an ohmic electrode, the ohmic electrode may be partly dissolved by a corrosive gas or a corrosive liquid at the time of etching, and this may lead to trouble, such as, a faulty contact, a film peeling or the like. However, as described in this invention, when the through hole 17 is created beneath the source electrode 13b as the second contact region, it is possible to prevent the trouble described above.

Figure 5F:
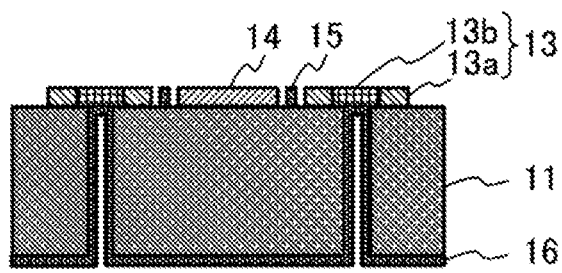

Lastly, as shown in FIG. 5F, the back-surface electrode 16 is formed by a sputtering, vapor deposition or like method. A plated film may be additionally formed on the back-surface electrode 16.

It is noted that, in Embodiment 1, a case has been described where the source electrode 13 is constituted by the source electrodes 13a as the first contact regions and the source electrode 13b as the second contact region; however, this is not limitative. It is allowed that the drain electrode 14 is constituted by a drain electrode(s) as the first contact region(s) and a drain electrode as the second contact region, and the drain electrode as the second contact region and the back-surface electrode are connected to each other through the through hole. Further, it is, of course, allowed that a through hole connects the gate electrode 15 having a second contact region thereof with the back-surface electrode.

Figure 6:
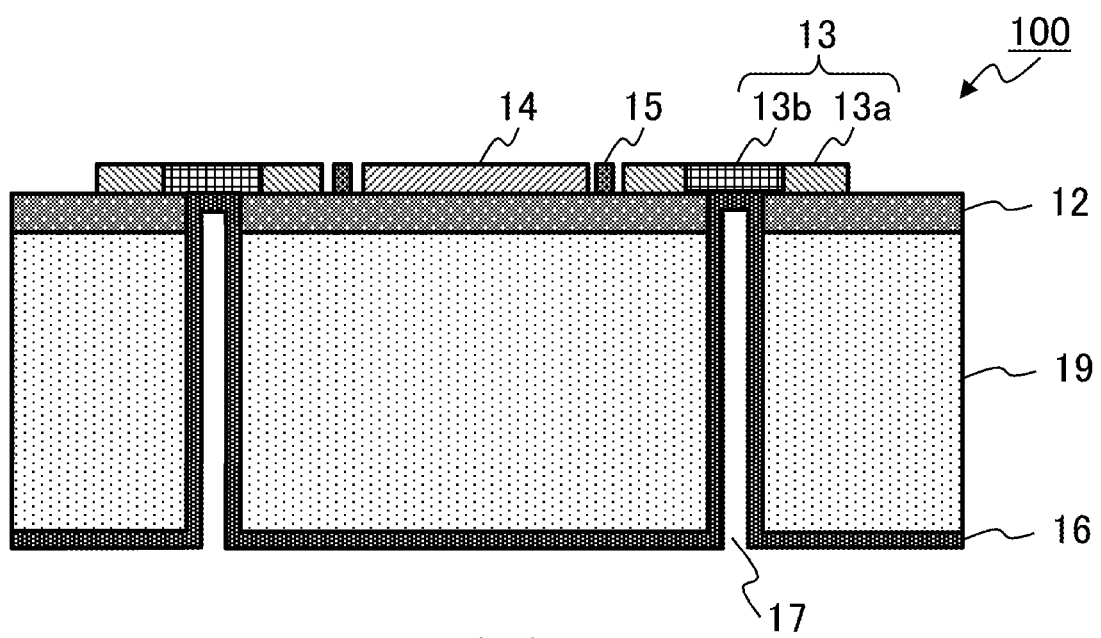
FIG. 6 is a sectional view showing another configuration of the semiconductor device according to Embodiment 1 of the invention.

Further, in Embodiment 1, the semiconductor substrate 11 is used; however, this is not limitative. For example, as shown in FIG. 6, which is a sectional view showing another configuration of the semiconductor device 100, such a product in which a semiconductor layer 12 is formed on an insulative substrate 19 may be used as the semiconductor substrate. The semiconductor layer 12 is exemplified by a single layered material of GaN, AlGaN, InAlN, AlN, diamond or the like, and otherwise, of GaAs, InP or the like, or a multi-layered material thereof.

Figure 7:
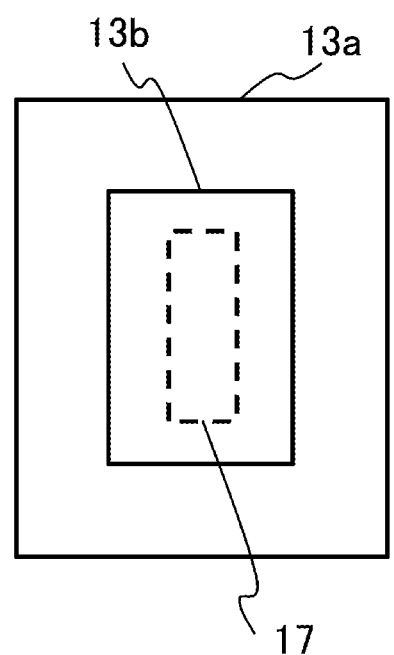
FIG. 7 is a plan view showing another configuration of the source electrode in the semiconductor device according to Embodiment 1 of the invention.

Further, in Embodiment 1, the source electrode 13b as the second contact region is provided between the source electrodes 13a as the first contact regions arranged in two rows; however, this is not limitative. For example, as shown in FIG. 7, which is a plan view showing another configuration of the source electrode 13, a source electrode 13a as the first contact region may be formed along the outer circumference of the source electrode 13b as the second contact region, and may also be formed into a curve-containing shape, such as a doughnut shape. It is appropriate if the source electrode 13 is configured to be joined to the semiconductor substrate 11 both at the source electrode 13a as the first contact region that is an ohmic contact region and at the source electrode 13b as the second contact region that is a non-ohmic contact or highly-resistive contact region.

Figure 8:
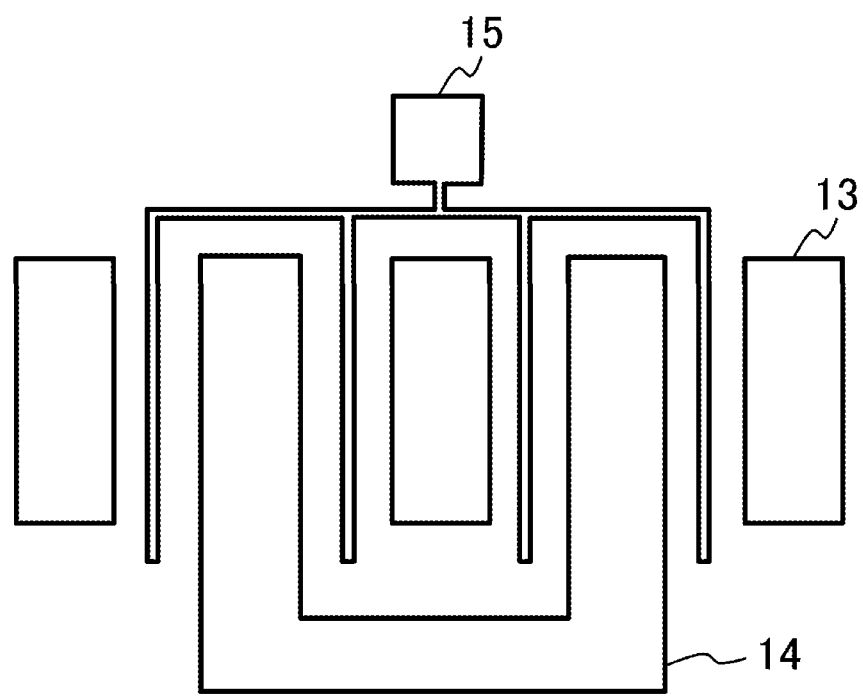
FIG. 8 is a plan view showing another configuration of a transistor in the semiconductor device according to Embodiment 1 of the invention.

Further, in Embodiment 1, as shown in FIG. 1, the description has been made about a configuration of a transistor that is provided with two source electrodes 13, one drain electrode 14 and two gate electrodes 15; however, this is not limitative. For example, as shown in FIG. 8, which is a plan view showing another configuration of three terminals of the transistor, a gate electrode 15 is placed at respective portions sandwiched between three source electrodes 13 and a drain electrode 14. As a result, four gate fingers are placed in this case. Transistors are usually used with such a multi-finger structure, and a case of four gate fingers is shown in this figure as an example; however, the number of gate fingers or their lengths may be determined depending on the design.

As described above, according to the semiconductor device 100 of Embodiment 1, it comprises: the source electrode 13 that is formed on a front surface of the semiconductor substrate 11 and that is joined to the semiconductor substrate 11 both at the source electrode 13a as the first contact region that is an ohmic contact region and at the source electrode 13b as the second contact region that is a non-ohmic contact or highly-resistive contact region; the back-surface electrode 16 formed on a back surface of the semiconductor substrate 11; and the through hole 17 in which an interconnection is provided that connects the source electrode 13b as the second contact region in the source electrode 13 with the back-surface electrode 16. Thus, with respect to the source electrode having the through hole, it is possible not only to improve the corrosion resistance in such a manner that the source electrode as the first contact region that is highly reactive is protected by the source electrode as the second contact region, but also to reduce the leakage current because of the provision of a portion as the second contact region, so that a highly-reliable semiconductor device suited for high frequency operation can be provided. Further, because the front-surface side and the back-surface side of the semiconductor substrate can be connected to each other, it is possible to improve the high-frequency characteristics.

Further, because the through hole 17 is as if it is protected by the source electrode 13b as the second contact region, it is possible to prevent atomic diffusion from the ohmic electrode that is highly reactive. Furthermore, it is possible to reduce a leakage current at the time the transistor is OFF. This is particularly effective when a hexagonal material (GaN, SiC or the like) is used for the semiconductor substrate.

Embodiment 2

In Embodiment 1, a case has been described where the source electrode 13 is joined to the semiconductor substrate 11 both at the source electrode 13a as the first contact region and at the source electrode 13b as the second contact region, whereas in Embodiment 2, such a case will be described where a protective film is further formed between the source electrode 13a as the first contact region and the source electrode 13b as the second contact region.

Figure 9:
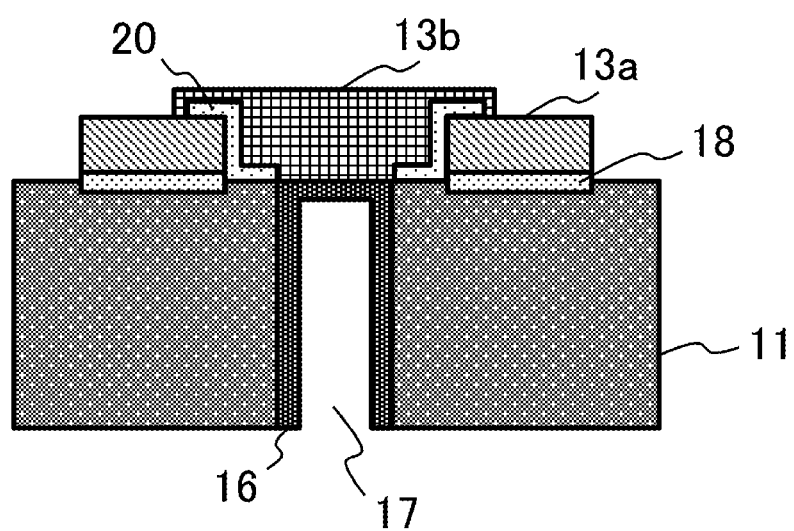
FIG. 9 is an enlarged sectional view showing a configuration of a source electrode in a semiconductor device according to Embodiment 2 of the invention.

FIG. 9 is an enlarged sectional view showing a configuration of the source electrode 13 in a semiconductor device 101 according to Embodiment 2 of the invention. As shown in FIG. 9, in the source electrode 13, a protective film 20 is formed between the source electrode 13a as the first contact region and the source electrode 13*b* as the second contact region, so as to protect the end portion of the source electrode 13*a* as the first contact region. The protective film 20 is a film of a metal that is lower in ionization tendency than the metal constituting the first contact region. The configuration of the semiconductor device 101 according to Embodiment 2, other than the protective film 20, is similar to the configuration of the semiconductor device 100 according to Embodiment 1, so that the figures used in Embodiment 1 are incorporated herein by reference, and description about the similar parts will be omitted. Further, in the production method of the semiconductor device 101 according to Embodiment 2, a step of forming the protective film 20 is added after the formation of the source electrode 13*a* as the first contact region. Other than that, the method is similar to the production method of the semiconductor device 100 according to Embodiment 1, so that the figures used in Embodiment 1 are incorporated herein by reference, and description about the similar parts will be omitted.

Figure 10:
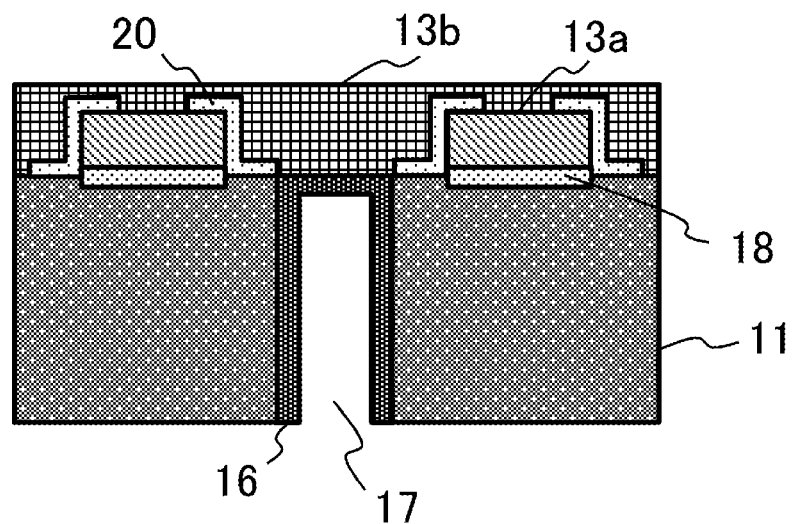
FIG. 10 is an enlarged sectional view showing another configuration of the source electrode in the semiconductor device according to Embodiment 2 of the invention.

In the semiconductor device 101, the protective film 20 is formed between the source electrode 13*a* as the first contact region and the source electrode 13*b* as the second contact region, so that the corrosion resistance of the source electrode 13*a* as the first contact region will be further improved. Further, when an insulator of SiN, SiO or the like is used as the protective film 20, it is possible to decrease the effective area of the source electrode 13 to thereby reduce a drain-source capacitance Cds of the transistor, and thus, it is possible to increase the bandwidth of the transistor. When a metal is used for the protective film 20, such a metal is used whose corrosion resistance is superior to the source electrode. For example, a low ionization-tendency metal, such as Pt, Au, Pd or the like, or a high melting-point metal, such as W, Ta, or the like that is superior in preventing heat diffusion, is used. Note that, as shown in FIG. 10, the protective film 20 may be formed not only on the inner side of the source electrode 13*a* as the first contact region but also on the outer side thereof.

As described above, according to the semiconductor device 101 of Embodiment 2, since the protective film 20 is formed between the source electrode 13*a* as the first contact region and the source electrode 13*b* as the second contact region, it is possible to further improve the corrosion resistance. Further, formation of the protective film near the through hole makes it possible to reduce the parasitic capacitance component of the transistor.

Embodiment 3

In Embodiment 1, a case has been described where the back-surface electrode 16 is formed on the back surface of the semiconductor substrate 11, whereas in Embodiment 3, such a case will be described where a diamond layer is formed between the back surface of the semiconductor substrate and the back-surface electrode.

Figure 11:
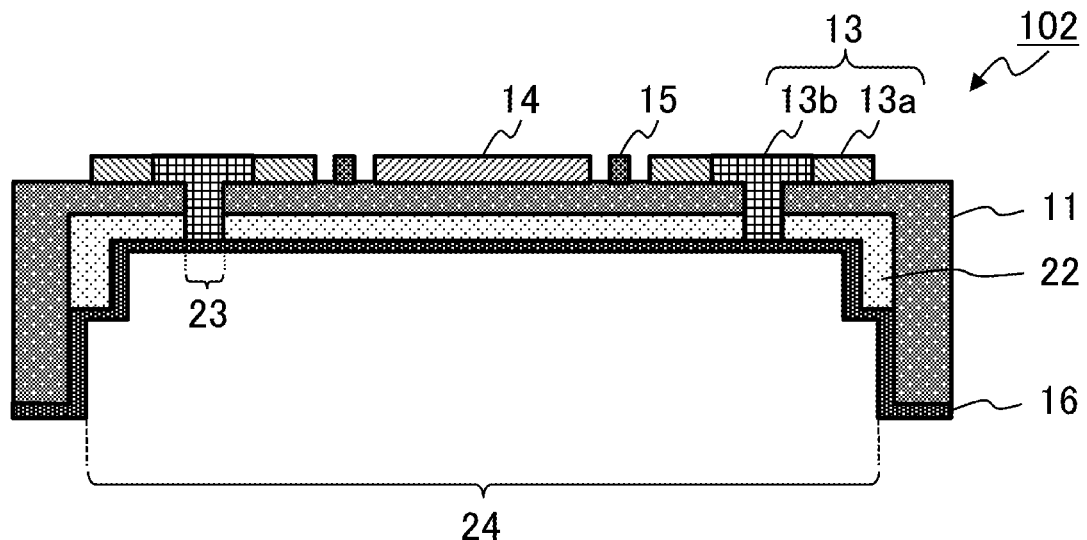
FIG. 11 is a sectional view showing a configuration of a semiconductor device according to Embodiment 3 of the invention.

FIG. 11 is a sectional view showing a configuration of a semiconductor device 102 according to Embodiment 3 of the invention. As shown in FIG. 11, a concave region 24 is created in the semiconductor substrate 11 on the back-surface side thereof. The concave region 24 has been created by the processing of a portion of the semiconductor substrate 11 beneath the source electrodes 13, the drain electrode 14 and the gate electrode 15. An insulative diamond layer 22 is formed on a bottom surface of the concave portion 24 and on side surfaces of the concave portion 24. A through hole 23 is obtained by the processing of a portion of the semiconductor substrate 11 and a portion of the insulative diamond layer 22 that are placed on the back side of the source electrode 13*b* as the second contact region, and serves for electrically connecting the source electrode 13 and the back-surface electrode 16 to each other. The configuration of the semiconductor device 102 according to Embodiment 3 other than the above is similar to the configuration of the semiconductor device 100 according to Embodiment 1, so that description about the similar parts will be omitted.

Next, based on FIGS. 12A to 12M, description will be made about a production method of the semiconductor device 102 according to Embodiment 3 of the invention. FIGS. 12A to 12M are sectional views showing producing steps of the semiconductor device 102 according to Embodiment 3 of the invention.

Figure 12A:
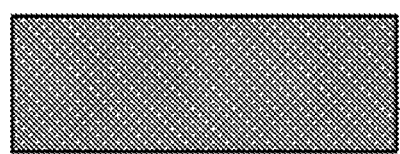
FIGS. 12A to 12M are sectional views showing producing steps of the semiconductor device according to Embodiment 3 of the invention.
Figure 12B:
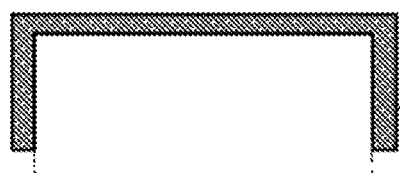

First, as shown in FIG. 12A, the semiconductor substrate 11 is made ready, and then, as shown in FIG. 12B, the concave region 24 is created in the semiconductor substrate 11 on the back-surface side thereof. The concave region 24 is created by etching of the semiconductor substrate 11.

Figure 12C:
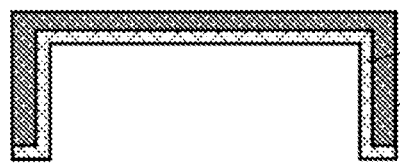

Subsequently, as shown in FIG. 12C, the insulative diamond layer 22 is formed on the back surface-side of the semiconductor substrate 11. The diamond layer can be formed by thermal filament CVD, plasma CVD or the like. At this formation, by the addition of an impurity gas of boron or the like, the impurity concentration in the layer can be adjusted. Further, even after the formation of the diamond layer, it is possible to adjust the impurity concentration by implanting impurities into the layer using ion implantation or the like. When the deposition temperature of the insulative diamond layer 22 is a high temperature (for example, 1000° C.), atomic diffusion may occur from an electrode material of the source electrode or the like, to the semiconductor substrate 11, so that it is desired to deposit the insulative diamond layer 22 before the formation of an structural object, such as the source electrode 13 and the like, on the front-surface side of the semiconductor substrate 11.

Figure 12D:
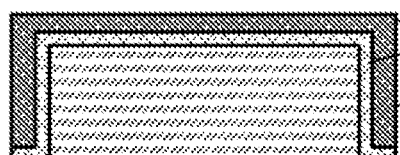

Then, as shown in FIG. 12D, an embedded mask 26 is formed on the back-surface side of the semiconductor substrate 11. The embedded mask 26 may be an organic film of a resist material, polyimide or the like, or a metal film of Cu or the like. When an organic film is to be used, it may be formed in such a manner that a dissolved material is applied to the back-surface side of the semiconductor substrate 11 by using a spin coater or the like. When a metal film is to be used as the embedded mask 26, a metal may be deposited selectively in the concave region 24 by using a technique of via-filling plating.

Figure 12E:
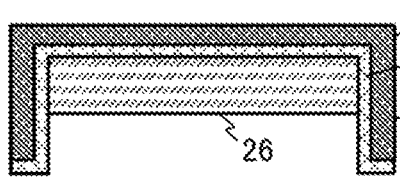
Figure 12F:
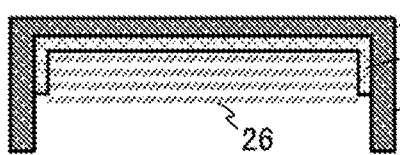
Figure 12G:
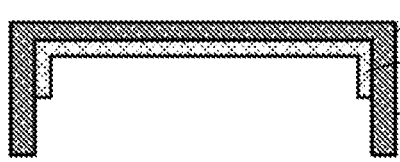

Subsequently, as shown in FIG. 12E, the embedded mask 26 is etched back. The etching method may be wet etching or dry etching. After the embedded mask 26 is etched back by a specified amount, as shown in FIG. 12F, a portion of the insulative diamond layer 22 that is not protected by the embedded mask 26 on the back-surface side of the semiconductor substrate 11, is etched off using dry etching or the like. By adjusting the thickness of the embedded mask 26 in the concave region 24 beforehand, it is possible to adjust the residual depth of the insulative diamond layer 22 along the side surface of the concave region 24. When the residual depth is set to be thinner than a thickness of the semiconductor substrate 11 after its back-surface grinding, it is possible to prevent trouble at the time of the back-surface grinding (diamond adhesion inside the concave region, breakage of a component of the grinding attachment, deformation in a ground surface of the substrate, or the like). Thereafter, as shown in FIG. 12G, the embedded mask 26 is removed.

Figure 12H:
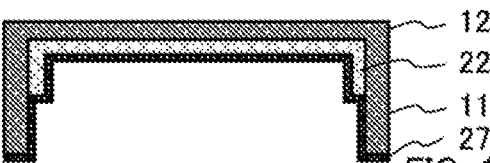

Then, as shown in FIG. 12H, an etching stopper layer 27 is formed on the back-surface side of the semiconductor substrate 11. Examples of the etching stopper material include an insulative film of SiO, SiN or the like, an organic film of novolac-type resist, polyimide or the like, and a metal such as Cr, Al, Ni, Cu or the like.

Figure 12I:
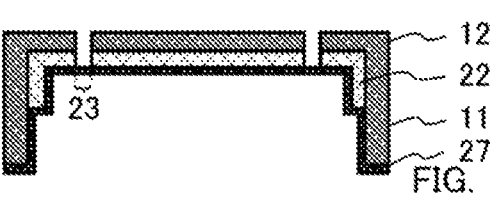
Figure 12J:
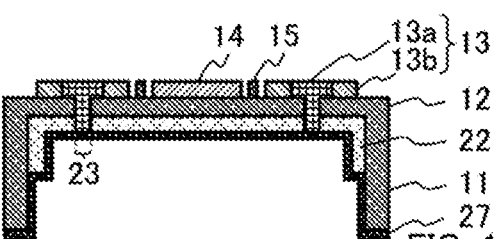
Figure 12K:
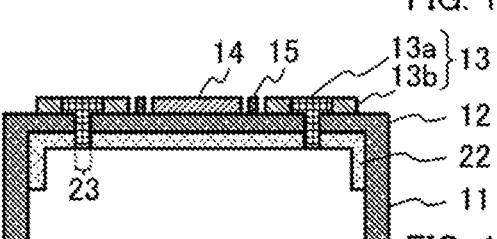

Subsequently, as shown in FIG. 12I, through holes 23 are created from the front-surface side of the semiconductor substrate 11. The through holes 23 can be created by etching of the semiconductor substrate 11 and the insulative diamond layer 22. The etching may be dry etching or wet etching. By use of the etching stopper layer 27, it is possible to selectively etching these layers. After creation of the through holes 23, as shown in FIG. 12J, the source electrodes 13 and the like are formed on the semiconductor substrate 11. The source electrode 13b as the second contact region is formed so as to fill the through hole 23. Thereafter, as shown in FIG. 12K, the etching stopper layer 27 is removed.

Figure 12L:
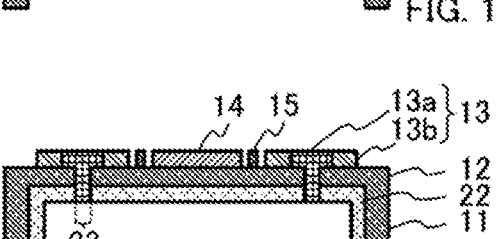
Figure 12M:
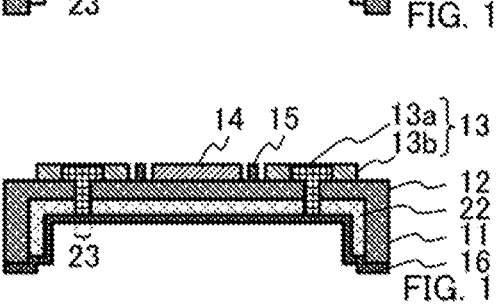

Lastly, as shown in FIG. 12L, the semiconductor substrate 11 is ground from the back-surface side, and thereafter, as shown in FIG. 12M, the back-surface electrode 16 is formed on the back-surface side of the semiconductor substrate 11. It is appropriate that the thickness of the semiconductor substrate 11 after the back-surface grinding is from about 10 to 200 μm. Although the back-surface electrode 16 may be a conformal film, it may also be formed in such a manner that the inside of the concave region 24 is filled with the metal. Further, it may be of a multi-layer structure made of multiple metals.

Figure 13:
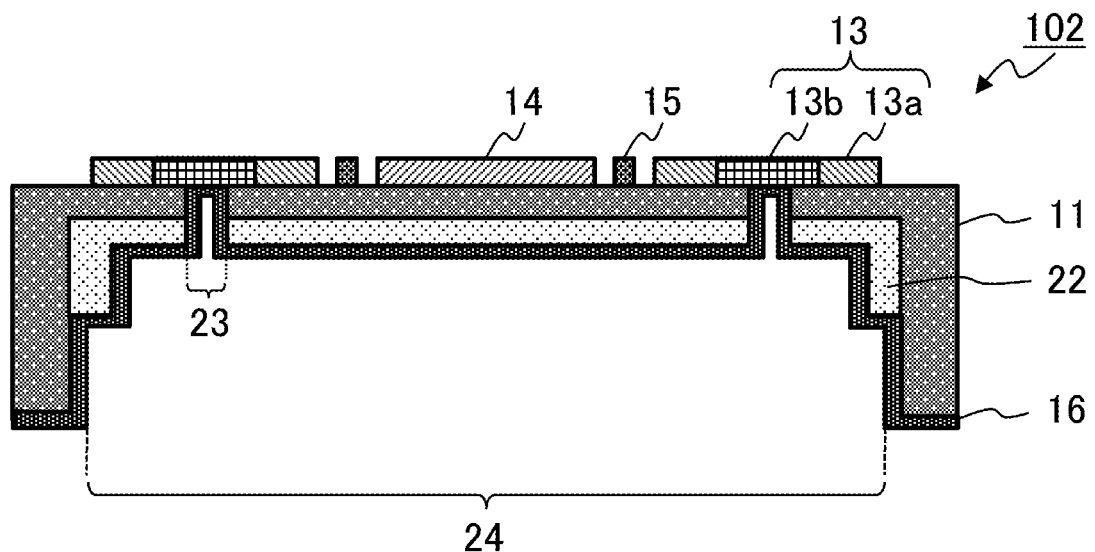
FIG. 13 is a sectional view showing another configuration of the semiconductor device according to Embodiment 3 of the invention.

It is noted that the inside of the through hole 23 is herein filled with the source electrode 13b as the second contact region; however, this is not limitative. For example, as shown in FIG. 13, which is a sectional view showing another configuration of the semiconductor device 102, such a structure may be employed in which the source electrode 13b as the second contact region is made flat and the back-surface electrode 16 is connected thereto passing through the through hole 23.

Figure 14:
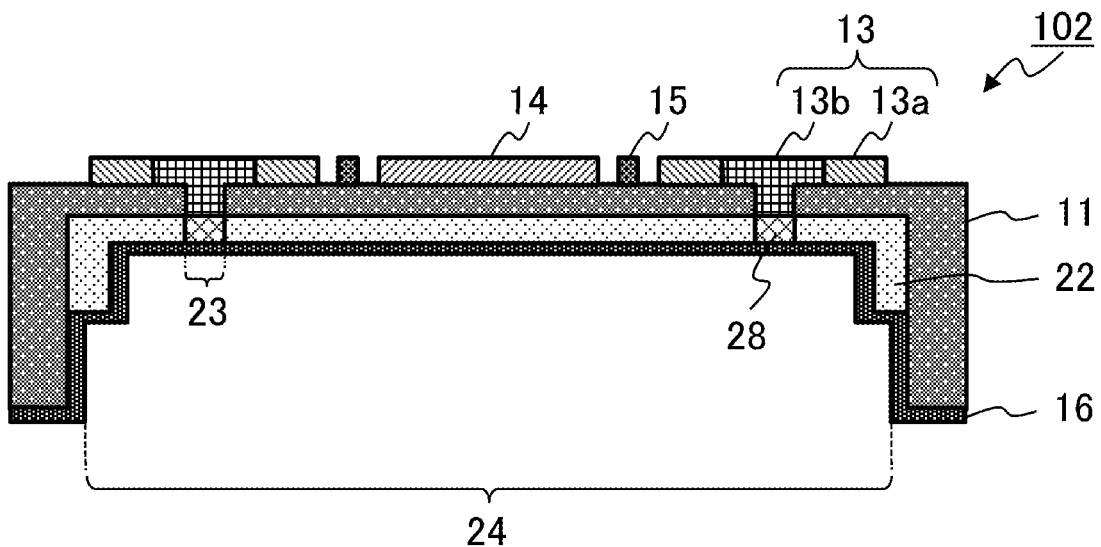
FIG. 14 is a sectional view showing another configuration of the semiconductor device according to Embodiment 3 of the invention.

Further, in Embodiment 3, the through hole 23 is fully filled with the source electrode 13b as the second contact region; however, this is not limitative. For example, as shown in FIG. 14, which is a sectional view showing another configuration of the semiconductor device 102, in a region of the through hole 23 corresponding to the insulative diamond layer, an electrically-conductive diamond layer 28 may be placed. This makes it possible to further enhance the heat dissipation capability of the transistor.

It is noted that the electrical conductivity of diamond depends on the concentration of added impurities and in general, when a large amount of impurities such as boron or the like are added, electrically conductive diamond is provided, and when the amount of the impurities is small, insulative diamond is provided. The lower the concentration of the impurities in diamond, the higher the heat dissipation capability becomes. Thus, it is desired that the electrically-conductive diamond layer 28 is formed only at an electrical connection position on the front-surface side or back-surface side of the semiconductor substrate 11.

The diamond layer can be formed by thermal filament CVD, plasma CVD or the like. At this formation, by the addition of an impurity gas of boron or the like, the impurity concentration in the layer can be adjusted. Further, even after the formation of the diamond layer, it is possible to adjust the impurity concentration by implanting impurities into the layer using ion implantation or the like.

As described above, according to the semiconductor device 102 of Embodiment 3, the concave region 24 is created in the semiconductor substrate 11 at a back surface-side position corresponding to the position of the source electrode 13; and between the semiconductor substrate 11 and the back-surface electrode 16, the insulative diamond layer 22 is formed to be placed on the bottom portion and the side portion of the concave region 24. Thus, since the concave region is created beneath the activated part of the transistor (around the source, the drain and the gate) and diamond is formed thereon, it is possible to improve the heat dissipation capability.

Further, because the through hole 23 is filled with the source electrode 13b as the second contact region, it is possible to prevent atomic diffusion from the ohmic electrode that is highly reactive. Furthermore, it is possible to reduce a leakage current at the time the transistor is OFF. This is particularly effective when a hexagonal material (GaN, SiC or the like) is used for the semiconductor substrate.

It should be noted that unlimited combination of the respective embodiments and an appropriate modification/ omission in the embodiments may be made in the present invention without departing from the scope of the invention.

DESCRIPTION OF REFERENCE NUMERALS
AND SIGNS

11: semiconductor substrate, 12: semiconductor layer, 13: source electrode, 13a: source electrode as a first contact region, 13b: source electrode as a second contact region, 16: back-surface electrode, 17: through hole, 18: modified layer, 19: insulative substrate, 20: protective film, 22: insulative diamond layer, 23: through hole, 24: concave region, 28: electrically-conductive diamond layer, 100, 101, 102: semiconductor device.

The invention claimed is:

1. A semiconductor device, comprising:
   a source electrode or a drain electrode that is formed on a front surface of a semiconductor substrate, and that is joined to the semiconductor substrate both at a first contact region of that electrode as an ohmic contact region and at a second contact region thereof as a non-ohmic contact region or a contact region having a resistance value higher than that of the ohmic contact region;
   a back-surface electrode formed on a back surface of the semiconductor substrate; and
   a through hole in which an interconnection is provided that connects the second contact region of the source electrode or the drain electrode with the back-surface electrode;
   wherein a concave region is created in the semiconductor substrate at a back surface-side position corresponding to a position of the source electrode or the drain electrode; and
   wherein, between the semiconductor substrate and the back-surface electrode, an insulative diamond layer is formed to be placed on a bottom portion and one part of a side portion of the concave region that is adjacent to the bottom portion, and the back-surface electrode is formed on another part of the side portion.

2. The semiconductor device according to claim 1, wherein, in the source electrode or the drain electrode, a protective film is formed between a portion with the first contact region and a portion with the second contact region.

3. The semiconductor device according to claim 1, wherein the through hole is filled with a portion of the source electrode or the drain electrode corresponding to the second contact region.

4. The semiconductor device according to claim 1, wherein, in a region of the through hole corresponding to the insulative diamond layer, an electrically-conductive diamond layer is formed.

5. The semiconductor device according to claim 3, wherein, in a region of the through hole corresponding to the insulative diamond layer, an electrically-conductive diamond layer is formed.

6. The semiconductor device according to claim 2, wherein the protective film is a film which is lower in ionization tendency than a metal that constitutes the first contact region.

7. The semiconductor device according to claim 2, wherein the protective film comprises an insulative film of silicon nitride, silicon oxide or aluminum oxide.

8. The semiconductor device according to claim 1, wherein the first contact region has a contact resistance value of not less than $1.0E-8$ $\Omega cm^2$ but not more than $1.0E-3$ $\Omega cm^2$.

9. The semiconductor device according to claim 2, wherein the first contact region has a contact resistance value of not less than $1.0E-8$ $\Omega cm^2$ but not more than $1.0E-3$ $\Omega cm^2$.

10. The semiconductor device according to claim 3, wherein the first contact region has a contact resistance value of not less than $1.0E-8$ $\Omega cm^2$ but not more than $1.0E-3$ $\Omega cm^2$.

11. The semiconductor device according to claim 1, wherein the semiconductor substrate comprises an insulative substrate and a semiconductor layer provided on a surface of the insulative substrate.

12. The semiconductor device according to claim 2, wherein the semiconductor substrate comprises an insulative substrate and a semiconductor layer provided on a surface of the insulative substrate.

13. The semiconductor device according to claim 3, wherein the semiconductor substrate comprises an insulative substrate and a semiconductor layer provided on a surface of the insulative substrate.

14. A semiconductor device production method, comprising:
a step of forming, on a front surface of a semiconductor substrate, a pattern for a source electrode or a drain electrode as a first contact region, and thereafter joining the semiconductor substrate to the pattern for the source electrode or the drain electrode as the first contact region by heating or by ion implantation, to thereby form the source electrode or the drain electrode as the first contact region;
a step of forming a pattern for a source electrode or a drain electrode as a second contact region, to be adjoined to the source electrode or the drain electrode as the first contact region, to thereby form the source electrode or the drain electrode as the second contact region;
a step of forming a metal mask on a back-surface side of the semiconductor substrate;
a step of creating, in the semiconductor substrate and beneath the source electrode or the drain electrode as the second contact region, a through hole that penetrates through the semiconductor substrate;
a step of removing the metal mask by dry etching or wet etching; and
a step of connecting, after formation of a back-surface electrode on a back surface of the semiconductor substrate, the source electrode or the drain electrode as the second contact region with the back-surface electrode through the through hole;
said semiconductor device manufacturing method further comprising:
after formation of the source electrode or the drain electrode as the first contact region, and before formation of the pattern for the source electrode or the drain electrode as the second contact region, to be adjoined to the source electrode or the drain electrode as the first contact region, a step of forming a protective film to be placed between the source electrode or the drain electrode as the first contact region and the source electrode or the drain electrode as the second contact region;
a step of creating a concave region in the semiconductor substrate at a back surface-side position corresponding to a position of the source electrode or the drain electrode as the second contact region; and
a step of forming an insulative diamond layer on a bottom portion and one part of a side portion of the concave region that is adjacent to the bottom portion, to be placed between the semiconductor substrate and a portion of the back-surface electrode, with another portion of the back-surface electrode being formed on another part of the side portion.

15. A semiconductor device production method, comprising:
a step of creating a concave region in a semiconductor substrate at a back surface-side position corresponding to a position of a source electrode or a drain electrode to be formed as a second contact region on that substrate;
a step of forming, on a front surface of the semiconductor substrate, a pattern for a source electrode or a drain electrode as a first contact region, and thereafter joining the semiconductor substrate to the pattern for the source electrode or the drain electrode as the first contact region by heating or by ion implantation, to thereby form the source electrode or the drain electrode as the first contact region;
a step of forming a protective film to be placed between the source electrode or the drain electrode as the first contact region and the source electrode or the drain electrode as the second contact region;
a step of forming a pattern for the source electrode or the drain electrode as the second contact region so that the protective film is sandwiched between said pattern and the source electrode or the drain electrode as the first contact region, to thereby form the source electrode or the drain electrode as the second contact region;
a step of forming an insulative diamond layer on a bottom portion and a part of a side portion of the concave region that is adjacent to the bottom portion on a back-surface side of the semiconductor substrate;
a step of creating, in the semiconductor substrate and beneath the source electrode or the drain electrode as the second contact region, a through hole that penetrates through the semiconductor substrate; and
a step of connecting, after formation of a back-surface electrode on a back surface of the diamond layer formed on the semiconductor substrate and on another part of the side portion of the concave region, the source electrode or the drain electrode as the second contact region with the back-surface electrode through the through hole.

16. The semiconductor device production method according to claim 14, further comprising a step of forming an electrically-conductive diamond layer in a region of the through hole corresponding to the insulative diamond layer.

17. The semiconductor device production method according to claim 15, further comprising a step of forming an electrically-conductive diamond layer in a region of the through hole corresponding to the insulative diamond layer.

18. A semiconductor device, comprising:
a source electrode or a drain electrode that is formed on a front surface of a semiconductor substrate, and that is joined to the semiconductor substrate both at a first contact region of that electrode as an ohmic contact region and at a second contact region thereof as a non-ohmic contact region or a contact region having a resistance value higher than that of the ohmic contact region;
a back-surface electrode formed on a back surface of the semiconductor substrate; and
a through hole in which an interconnection is provided that connects the second contact region of the source electrode or the drain electrode with the back-surface electrode;
wherein a concave region is created in the semiconductor substrate at a back surface-side position corresponding to a position of the source electrode or the drain electrode;
wherein, between the semiconductor substrate and the back-surface electrode, an insulative diamond layer is formed to be placed on a bottom portion and a side portion of the concave region; and
wherein, in a region of the through hole corresponding to the insulative diamond layer, an electrically-conductive diamond layer is formed.

19. A semiconductor device production method, comprising:
a step of forming, on a front surface of a semiconductor substrate, a pattern for a source electrode or a drain electrode as a first contact region, and thereafter joining the semiconductor substrate to the pattern for the source electrode or the drain electrode as the first contact region by heating or by ion implantation, to thereby form the source electrode or the drain electrode as the first contact region;
a step of forming a pattern for a source electrode or a drain electrode as a second contact region, to be adjoined to the source electrode or the drain electrode as the first contact region, to thereby form the source electrode or the drain electrode as the second contact region;
a step of forming a metal mask on a back-surface side of the semiconductor substrate;
a step of creating, in the semiconductor substrate and beneath the source electrode or the drain electrode as the second contact region, a through hole that penetrates through the semiconductor substrate;
a step of removing the metal mask by dry etching or wet etching; and
a step of connecting, after formation of a back-surface electrode on a back surface of the semiconductor substrate, the source electrode or the drain electrode as the second contact region with the back-surface electrode through the through hole;
said semiconductor device manufacturing method further comprising:
after formation of the source electrode or the drain electrode as the first contact region, and before formation of the pattern for the source electrode or the drain electrode as the second contact region, to be adjoined to the source electrode or the drain electrode as the first contact region, a step of forming a protective film to be placed between the source electrode or the drain electrode as the first contact region and the source electrode or the drain electrode as the second contact region;
a step of creating a concave region in the semiconductor substrate at a back surface-side position corresponding to a position of the source electrode or the drain electrode as the second contact region;
a step of forming an insulative diamond layer on a bottom portion and a side portion of the concave region, to be placed between the semiconductor substrate and the back-surface electrode; and
a step of forming an electrically-conductive diamond layer in a region of the through hole corresponding to the insulative diamond layer.

20. A semiconductor device production method, comprising:
a step of creating a concave region in a semiconductor substrate at a back surface-side position corresponding to a position of a source electrode or a drain electrode to be formed as a second contact region on that substrate;
a step of forming, on a front surface of the semiconductor substrate, a pattern for a source electrode or a drain electrode as a first contact region, and thereafter joining the semiconductor substrate to the pattern for the source electrode or the drain electrode as the first contact region by heating or by ion implantation, to thereby form the source electrode or the drain electrode as the first contact region;
a step of forming a protective film to be placed between the source electrode or the drain electrode as the first contact region and the source electrode or the drain electrode as the second contact region;
a step of forming a pattern for the source electrode or the drain electrode as the second contact region so that the protective film is sandwiched between said pattern and the source electrode or the drain electrode as the first contact region, to thereby form the source electrode or the drain electrode as the second contact region;
a step of forming an insulative diamond layer on a bottom portion and a side portion of the concave region on a back-surface side of the semiconductor substrate;
a step of creating, in the semiconductor substrate and beneath the source electrode or the drain electrode as the second contact region, a through hole that penetrates through the semiconductor substrate;
a step of connecting, after formation of a back-surface electrode on a back surface of the diamond layer formed on the semiconductor substrate, the source electrode or the drain electrode as the second contact region with the back-surface electrode through the through hole; and
a step of forming an electrically-conductive diamond layer in a region of the through hole corresponding to the insulative diamond layer.

* * * * *